United States Patent
Tran et al.

(10) Patent No.: US 10,243,551 B1
(45) Date of Patent: Mar. 26, 2019

(54) OVER VOLTAGE PROTECTION FOR CASCODE SWITCHING POWER DEVICE

(71) Applicant: Alpha and Omega Semiconductor (Cayman) Ltd., Grand Cayman (KY)

(72) Inventors: Son Tran, San Jose, CA (US); Fred Sawyer, Foxboro, MA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 0 days.

(21) Appl. No.: 15/697,381

(22) Filed: Sep. 6, 2017

(51) Int. Cl.
| | |
|---|---|
| H03K 17/082 | (2006.01) |
| H03K 17/0814 | (2006.01) |
| H02H 9/04 | (2006.01) |
| H02H 3/12 | (2006.01) |
| H02H 3/20 | (2006.01) |
| H02M 3/158 | (2006.01) |

(52) U.S. Cl.
CPC .......... H03K 17/0822 (2013.01); H02H 3/12 (2013.01); H02H 3/202 (2013.01); H02H 9/043 (2013.01); H02M 3/158 (2013.01); H03K 17/08142 (2013.01)

(58) Field of Classification Search
CPC .................................................. H02H 3/202
See application file for complete search history.

(56) References Cited

U.S. PATENT DOCUMENTS

| | | |
|---|---|---|
| 4,659,942 A | 4/1987 | Volp |
| 4,877,972 A | 10/1989 | Sobhani et al. |
| 5,313,109 A | 5/1994 | Smith |
| 5,602,724 A | 2/1997 | Balakrishnan |
| 5,745,670 A | 4/1998 | Linde |
| 5,894,415 A | 4/1999 | Habegger |
| 6,257,216 B1 | 7/2001 | Förster et al. |
| 6,775,164 B2 | 8/2004 | Wong et al. |
| 7,176,665 B2 | 2/2007 | Knoedgen et al. |
| 8,653,881 B2 | 2/2014 | Ivankovic |
| 8,779,841 B2 | 7/2014 | Ivankovic |
| 9,041,433 B2 | 5/2015 | Ausseresse et al. |
| 9,112,422 B1 | 8/2015 | Vinciarelli |
| 9,468,055 B2 | 10/2016 | Cheng et al. |
| 9,722,599 B1 | 8/2017 | Ivankovic et al. |
| 9,912,241 B2 | 3/2018 | Ivankovic et al. |
| 2003/0021113 A1 | 1/2003 | Begemann |
| 2007/0070659 A1 | 3/2007 | Sawtell |
| 2008/0088292 A1 | 4/2008 | Stoichita et al. |
| 2009/0140791 A1 | 6/2009 | Young |
| 2009/0168469 A1 | 7/2009 | Dishman et al. |

(Continued)

*Primary Examiner* — Jeffery S Zweizig
(74) *Attorney, Agent, or Firm* — JDI Patent; Joshua D. Isenberg; Robert Pullman

(57) ABSTRACT

Aspects of the present disclosure disclose a power semiconductor device coupled to a load operable to draw a load current comprising a power switch having a first terminal coupled to the load and a controller coupled to a control terminal of the power switch. The controller comprises a gate driving circuit configured to provide control of the control terminal of the power switch during normal switching operations; an overvoltage detection circuit configured to detect an overvoltage event occurring at the first terminal of the power switch; and an overvoltage protection circuit configured to provide control of the control terminal of the power switch during detection of the overvoltage event.

16 Claims, 7 Drawing Sheets

(56) References Cited

U.S. PATENT DOCUMENTS

| | | |
|---|---|---|
| 2012/0086402 A1 | 4/2012 | Carder |
| 2014/0035627 A1 | 2/2014 | Dunipace |
| 2014/0277802 A1 | 9/2014 | Tomas et al. |
| 2015/0091536 A1 | 4/2015 | Tanaka |
| 2015/0214829 A1 | 7/2015 | Xu et al. |
| 2015/0280574 A1 | 10/2015 | Gong et al. |
| 2017/0207618 A1* | 7/2017 | Miyazawa .............. F02P 15/00 |

* cited by examiner

OVER VOLTAGE PROTECTION FOR CASCODE SWITCHING POWER DEVICE

FIELD OF THE DISCLOSURE

This disclosure relates in general to semiconductor devices and, in particular, to over voltage protection for power semiconductor devices.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like. Power MOSFETs have typically been developed for applications requiring power switching and power amplification.

In one application, flyback converters, which generate a DC output from either an AC or DC input, are a simple switch mode power supply using a power MOSFET. FIG. 1 depicts a conventional flyback converter. When the MOSFET switch S turns on, energy from the input source $V_{in}$ is applied and a current flows through the primary windings energizing a transformer T. The current in primary side of the transformer T ramps up proportional to the input voltage $V_{in}$. During this time, the output diode D is reverse-biased and off. The voltage applied to the diode D is equal to the output voltage $V_{out}$ plus the reflected input voltage (i.e., $V_{in}*(N_2/N_1)$). The output capacitor C supplies the load current $I_o$ during the on-time of the MOSFET switch S.

When enough energy is stored in the primary side of transformer T, the MOSFET switch S is turned off and the energy in the transformer T transfers to the secondary side and current flows through the diode D. The diode D is now forward-biased, replenishing the energy in the output capacitor C and supplying the load. The current in the secondary side of transformer T ramps down proportionally to output voltage $V_{out}$. During this time, the primary side is considered an open circuit. The voltage applied to the MOSFET switch S is equal to the input voltage $V_{in}$ plus the reflected output voltage (i.e., $V_{out}*(N_1/N_2)$).

Flyback converters may be operated in different modes. In one example, a fly-back converter is designed with a fixed switching frequency and modulates the peak current to supply the load demands. In another example, a fly-back converter can be operated in quasi-resonant mode (QR), where the switching occurs on the very first and deepest resonant valley. QR delivers the maximum amount of power by adjusting both the peak current and the switching frequency to turn the MOSFET switch on at the first resonant valley where VDS is at or near zero for minimal turn-on losses.

However, the benefits of flyback converters in the QR mode are reduced when used at high input voltage (e.g., over 300 V AC). This is due to the fact that higher reflected voltages require using a MOSFET with a correspondingly higher breakdown voltage rating. The use of a MOSFET with higher breakdown voltage increases the cost and inherently increases the drain-source on resistance ($R_{ds-on}$) and the switching capacitance of the MOSFET. Lower breakdown MOSFETS can be used however at low load and high line voltages but the zero voltage switching capability is compromised and not achieved over the full load range. One of the proposed methods uses a cascode switch to maximize reflected voltage and utilize a MOSFET voltage level which affords the QR operation. Cascode switches typically have two or more power transistors (e.g., MOSFETs) connected in series. The load voltage is distributed across all of the series connected power transistors. As such, the use of the cascode switch increases the overall breakdown voltage without adding cost or appreciably compromising MOSFET performance.

Overvoltages have been a challenging issue for power devices (e.g., switches in fly-back converters). Overvoltages including voltage spikes from parasitic capacitances and transformer inductances, surges and fast transients, often occur during a flyback converter's normal operation and start up. Overvoltages may cause problematic field failure results of the power transistors. It is thus desirable to identify fault conditions (e.g., fault current and fault voltage) during operation of power devices and to activate suitable remedial action.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced.

Aspects of the present disclosure describe a power converter using a cascode switch with an integrated overvoltage protection. One aspect of the present disclosure describes an overvoltage protection for the cascode switch by soft clamping the gate voltage of the low-side switch to control the breakdown leakage current of the high-side switch and soft turning off the low-side switch to prevent oscillation. One aspect of the present disclosure describes an overvoltage protection for the cascode switch by soft clamping the gate voltages of the low-side and high-side switches to control the on current and soft turning off the low-side and high-side switch to prevent oscillation.

Figure 2:
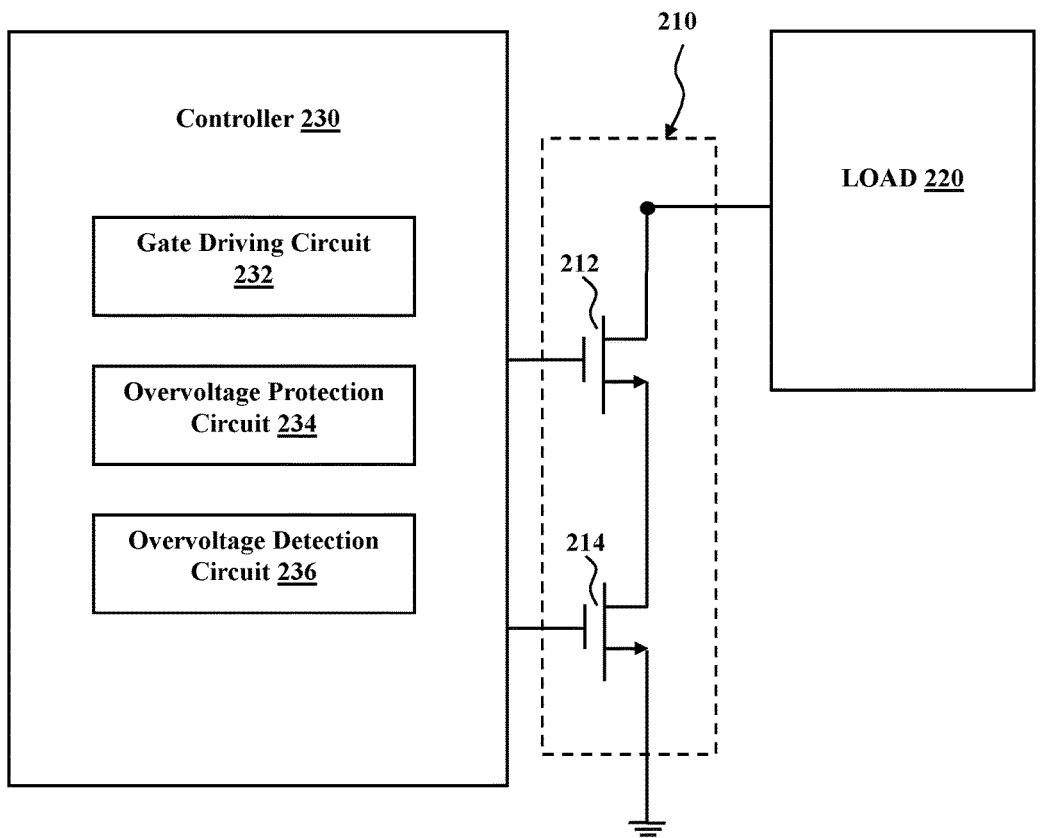
FIG. 2 is a block diagram illustrating a power converter according to aspects of the present disclosure.

FIG. 2 is block diagram of circuit illustrating a power converter according to aspects of the present disclosure. The power converter 200 includes a cascode switch 210 coupled to a load 220 and a controller 230 coupled to the switch 210.

The cascode switch 210 includes a first power transistor 212 coupled to the load 220 and a second power transistor 214 coupled in series between the first power transistor 212 and ground. The power transistors 212 and 214 are switched on and off in order to switch the load current as demanded. The first transistor 212 is referred to herein as high-side transistor or switch and the second transistor 214 is referred to as low-side transistor or switch. In one implementation, the power transistors 212 and 214 may be power MOFETs. In other implementations, the power transistors 212 and 214 may be insulated gate bipolar transistors (IGBTs). Furthermore, cascode switches of the types described herein may be used in other application where higher voltages need to be supported, such as half-bridge configurations and forward converter topologies.

Figure 1:
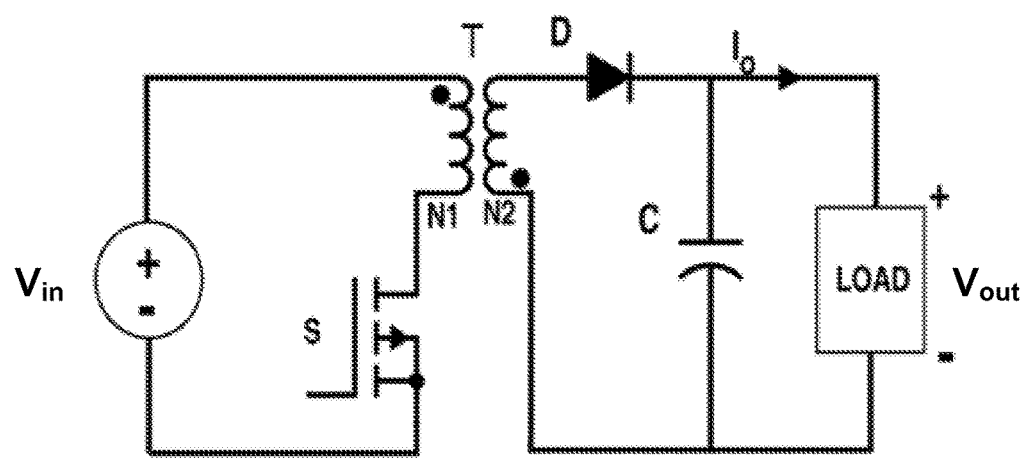
FIG. 1 is a circuit diagram illustrating a conventional flyback converter.

The cascode switch 210 is coupled to a load 220. By way of example and not by way of limitation, the load 220 may be a transformer having a primary coil and a secondary coil electromagnetically coupled through a magnetically permeable core similar to the transformer T of FIG. 1. In such an implementation, the primary coil of the transformer (not shown) is connected to an input source and the secondary coil is connected to a load via an output diode. The drain of the high-side switch 212 is coupled to the primary coil of the transformer.

The controller 230 in the power converter 200 is configured to provide normal control of the switching operation as demanded (e.g., flyback operation) and also to provide control of the gate voltages and turning on and off of the low-side and high-side switches 212 and 214 in the event of an overvoltage. The controller 230 includes a gate driving circuit 232, an overvoltage protection circuit 234 and an overvoltage detection circuit 236. In one embodiment, the controller 230 is a QR controller. The gate driving circuit 232 in the controller 230 is configured to support normal flyback operation. The overvoltage detection circuit 236 is configured to detect fault occurrences or overvoltages, e.g., at the drain of the high-side switch 212 and activate overvoltage protection functions implemented by the overvoltage protection circuit 234.

Figure 3:
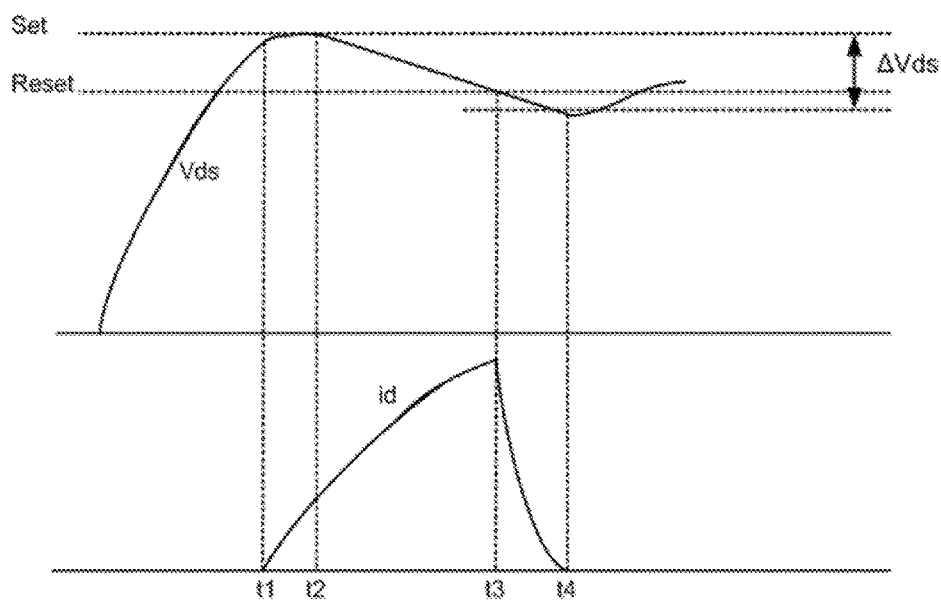
FIG. 3 depicts the signal waveform of the drain-to-source voltage of the cascode switch of FIG. 2 corresponding to its drain current.

The overvoltage protection design according to the present disclosure makes the energy induced in primary side inductor current to be consumed in the cascode switch 210 and the drain-to-source capacitor voltage of the switch 210 clamped in a level so that it does not increase over the damage level of the cascode switch 210. The drain-to-source capacitor voltage is effectively the same as the drain-to-source voltage. The level is defined as set and reset voltages by the hysteresis band in the overvoltage detection circuit 236. FIG. 3 depicts the signal waveform of the drain-to-source voltage of the cascode switch 210 corresponding to its drain current. At time $t_1$, the drain-to-source voltage of the cascode switch 210 reaches the set voltage. The drain current of the switch 210 begins to increase slowly by gate control. As a result, the flow direction of the primary side inductor current changes to the switch 210 and its drain-to-source voltage is clamped to a certain level. At time $t_2$, the drain current of the switch 210 equals to primary side inductor current. The drain-to-source capacitor ($C_{DS}$) of the switch starts to discharge and thus its drain-to-source voltage begins to fall. The falling slope is determined in accordance with the values of the drain current and the drain-to-source capacitance. At time $t_3$, the drain-to-source voltage of the switch 210 reaches the reset level. At this time, the drain current is decreasing by a soft gate control to obtain a safe shutdown of the switch 210. As shown in FIG. 3, during the current falling interval time (i.e., time $t_3$-$t_4$) the drain-to-source voltage of the switch 210 falls below the reset value. At time $t_4$, the switch 210 is turned off and the overvoltage protection is over. The remaining energy stored in the primary side of the transformer transfers to the secondary side and flows to the output diode supplying the load. The detailed description of the controller 230 and its gate voltage control is discussed below in connection with FIGS. 4-7.

Embodiment 1

Figure 4:
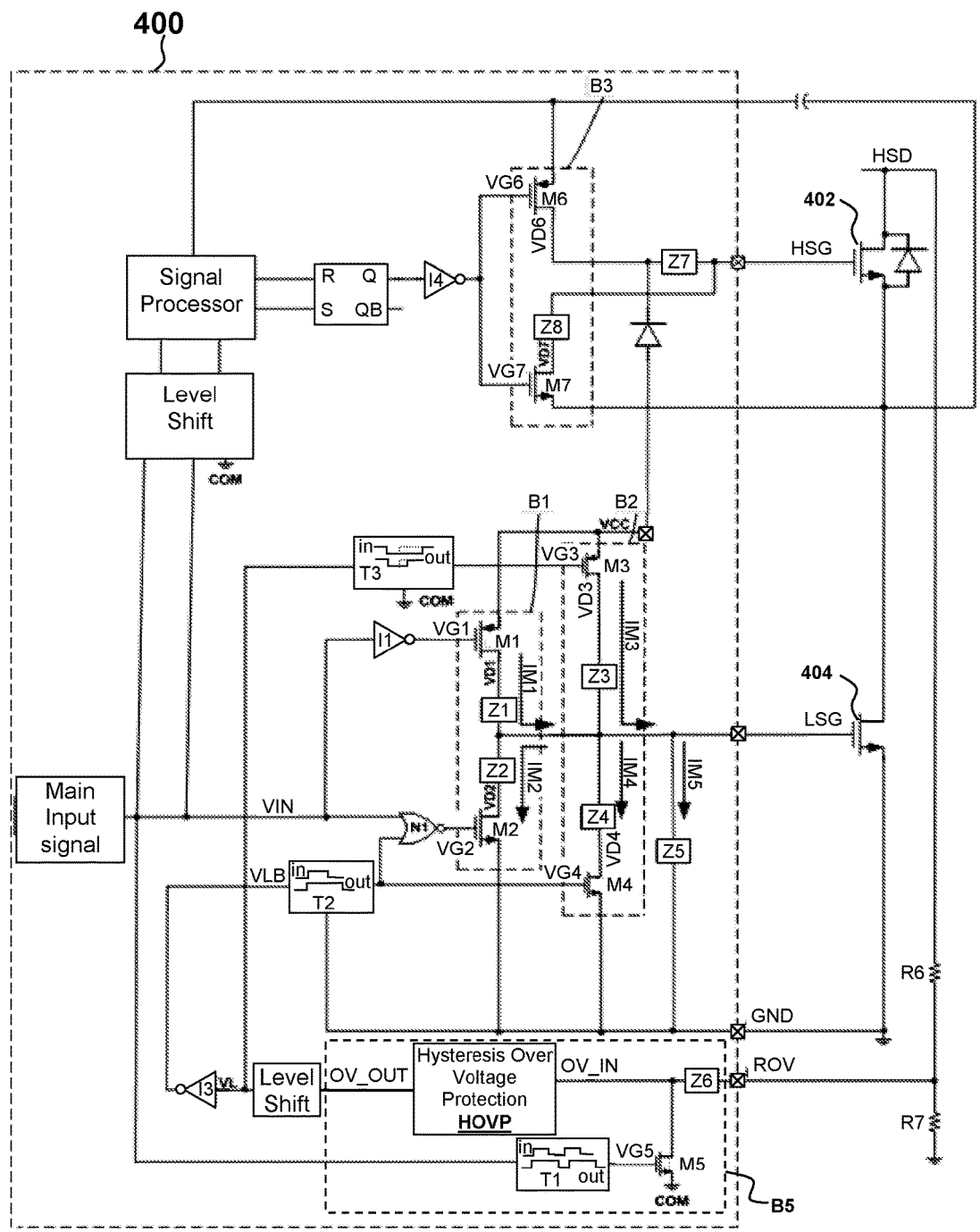
FIG. 4 is a circuit diagram illustrating a controller employed in a power switch according to aspects of the present disclosure.
Figure 5:
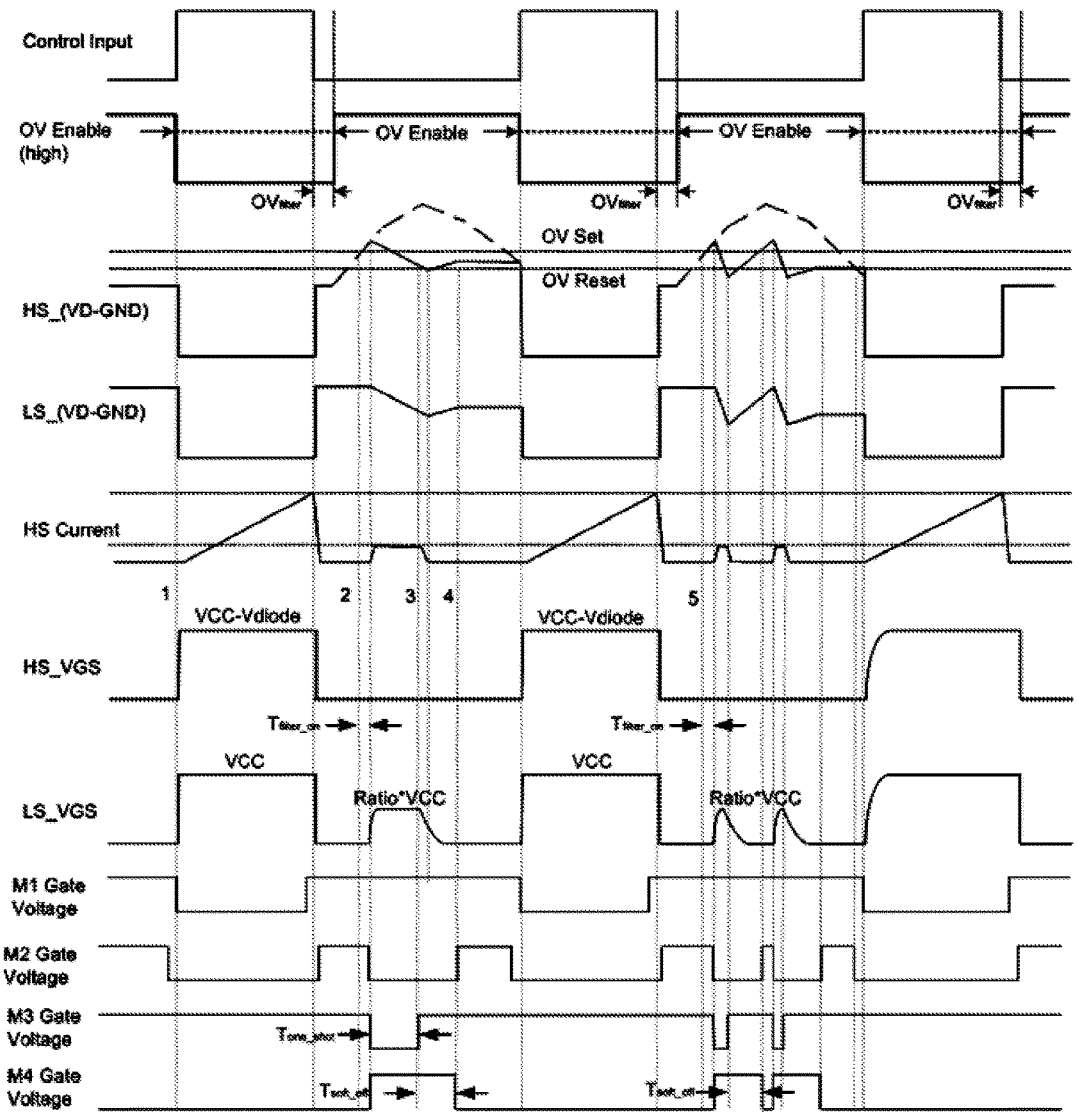
FIG. 5 is a timing diagram illustrating signal waveforms associated with the operation of a controller of FIG. 4.

FIG. 4 is a circuit diagram illustrating a controller employed in a power switch according to one aspect of the present disclosure. FIG. 5 is a timing diagram showing signal waveforms associated with the operation of a controller of FIG. 4. In this embodiment, the controller 400 includes an overvoltage protection for the cascode switch by clamping the gate voltage of the low-side switch 404 to control the breakdown leakage current of the high-side switch 402 and then turning off the low-side switch 404.

The controller 400 is coupled to the gate of the high-side switch 402 and the gate of the low-side switch 404. In this embodiment, the low-side switch 404 may be a power MOSFET with a relatively low rating and the high-side switch 402 may be a power MOSFET with a higher rating than the low-side switch 404. In one example, the high-side switch 402 may be based on superjunction transistors capable of supporting up to 600 Volts. The controller 400 has a LS gate driver B1 for driving the gate of the low-side switch 404 and a HS gate driver B3 for driving the gate of the high-side switch 402. The controller 400 also has a overvoltage protection circuit B2 coupled between the LS gate driver B1 and the gate of the low-side switch 404. In addition, the controller 400 includes an overvoltage detection circuit B5 for detecting fault occurrences at the drain of high-side switch 402.

The LS gate driver B1 includes at least switches M1 and M2, and the HS gate driver B3 includes switches M6 and M7. In one embodiment, switches M1, M2, M6 and M7 are MOSFET transistors. During the normal flyback operation, switches M1 and M2 of the LS gate driver B1 and switches M6 and M7 of HS gate driver B3 are turned on and off according to the main input signal $V_{IN}$. Specifically, combination of switch M1 and a first impedance Z1 in the LS gate driver B1 is configured to make the desired turn-on switching performance of the low-side switch 404. In addition, combination of switch M2 and a second impedance Z2 is configured to make an optimal turn-off of the low-side switch 404. Similarly, combination of switch M6 and a third impedance Z7 in the HS gate driver B3 is configured to make the desired turn-on switching performance of the high-side switch 402 and combination of switch M7 and a fourth impedance Z8 is configured to make an optimal turn-off of the high-side switch 402. By way of example and not by way of limitation, the impedances Z1, Z2, Z7 and Z8 may be provided by resistors or combinations of resistors and capacitors.

An overvoltage detection circuit B5 of the controller 400 includes at least a detector element. In one embodiment, the detector element is a hysteresis overvoltage detection device HOVD, which is a high gain comparator characterized by hysteresis band and fast response time. The detector HOVD may use band gap reference voltage (i.e., the set and reset voltages) to precisely control the voltage at the drain of the high-side switch 402 to stay in a safe level during fault conditions due to the voltage surge. The overvoltage detection circuit B5 also includes a switch M5 with a time control setting T1. Combination of the time control setting T1 and switch M5 is configured to provide a digital filter for entire PWM turn-on period and a transition from PWM on to off for avoiding malfunction of overvoltage protection due to noise coupling. In addition, a fifth impedance Z6 in the overvoltage detection circuit B5 between the detector HOVD and the drain of the high-side switch 402 provides ESD protection for switch M5 and analog filter for detector HOVD. The fifth impedance Z6 may be provided by resistor or a combination of a resistor and capacitor.

Once the voltage at the drain of high-side switch is higher than a set level of a fault voltage, the detector HOVD detects an overvoltage and sends a signal to deactivate switch M2 (e.g., by NOR gate N1) and activate the overvoltage protection circuit B2. At this time, switch M1 is off because the main input signal $V_{IN}$ is low.

The overvoltage protection circuit B2 includes at least switches M3 and M4. In one embodiment, switches M3 and M4 are MOSFETs. Switches M3 and M4 are turned off during normal flyback operation. When the overvoltage protection circuit B2 is activated by the overcharge detector B5, switches M3 and M4 are turned on simultaneously. Combination of switches M3 and M4 and impedances Z3 and Z4 allows a soft rise of the gate voltage of the low-side switch 404 beyond its threshold voltage. The maximum gate voltage of the low-side switch 404 is maintained or clamped by the overvoltage protection circuit B2 (i.e., the switches M3 and M4 and the impedances Z3 and Z4) at a voltage level proportional to the resistance ratio of impedances Z3 and Z4 (i.e., $Z4/(Z3+Z4)*V_{CC}$). By way of example, and not by way of limitation, impedances Z3 and Z4 may be resistors or combinations of resistors and capacitors. At this time, the drain current of the low-side switch 404 starts to ramp up discharging its drain voltage until the drain-source voltage of the high-side switch 402 reaches its breakdown voltage. When the high-side switch 402 reaches its breakdown voltage, the high-side switch 402 produces leakage current which in turn discharges the drain voltage of the high-side switch 402. The overvoltage protection circuit B2 allows a soft clamping of the gate voltage of the low-side switch 404 (by using switches M3 and M4 and impedances impedances Z3 and Z4) so as to control the breakdown leakage current of the high-side switch 402.

Next, switch M3 is deactivated when the detector HOVD of the overvoltage detection circuit B5 detects the drain voltage of the high-side switch 402 becomes lower than a reset level of the fault voltage (or when the time control setting T3 expires whichever comes first). With a time control setting T2, switch M4 maintains turned on for a fixed amount of time to provide a soft turn-off of the low-side switch 404. In the illustrated example, the low side switch 404 turns off when time control T2 expires and the high side switch 402 is always off during over voltage event. The controller according to the present disclosure may control the sharing of the blocking voltage by adjusting the time control setting T2. When the time control T2 expires, switch M4 turns off and switch M2 turns back on to provide the strong pull low for the gate of the low-side switch 404. M3 will be turn on and turn off by ROV (not by one shot) because the time it takes for ROV goes above and below the OV set and OV reset threshold is shorter than one shot time. M4 keeps on for additional time for M3 rising edge. M3 will turn on when OV_OUT goes low during over voltage events and is turned off either when OV_OUT goes high or by the oneshot whichever comes first during over voltage events. The overvoltage protection period is thus over and the overvoltage protection circuit B2 is deactivated. At this time, the normal flyback operation resumes.

According to aspects of the present disclosure, the gate voltage of the low-side switch 404 can be clamped and precisely controlled without any overshoot phenomena that may occur in the conventional zener-diode clamping method. The controller according to the present disclosure does not need an additional voltage supply for the reference voltage because the voltage clamping for the low-side switch 404 is set by the ratio of Z3 and Z4. The controller can also provide the gate voltage control capability irrespective of temperature variation due to the same temperature dependency of impedances Z3 and Z4. The desired soft turn-off of the low-side switch 404 for the safe shutdown is obtained by combination of switch M4 and impedance Z4. Therefore the overvoltage protection circuit can be simply integrated with the existing gate drive circuit.

Embodiment 2

Figure 6:
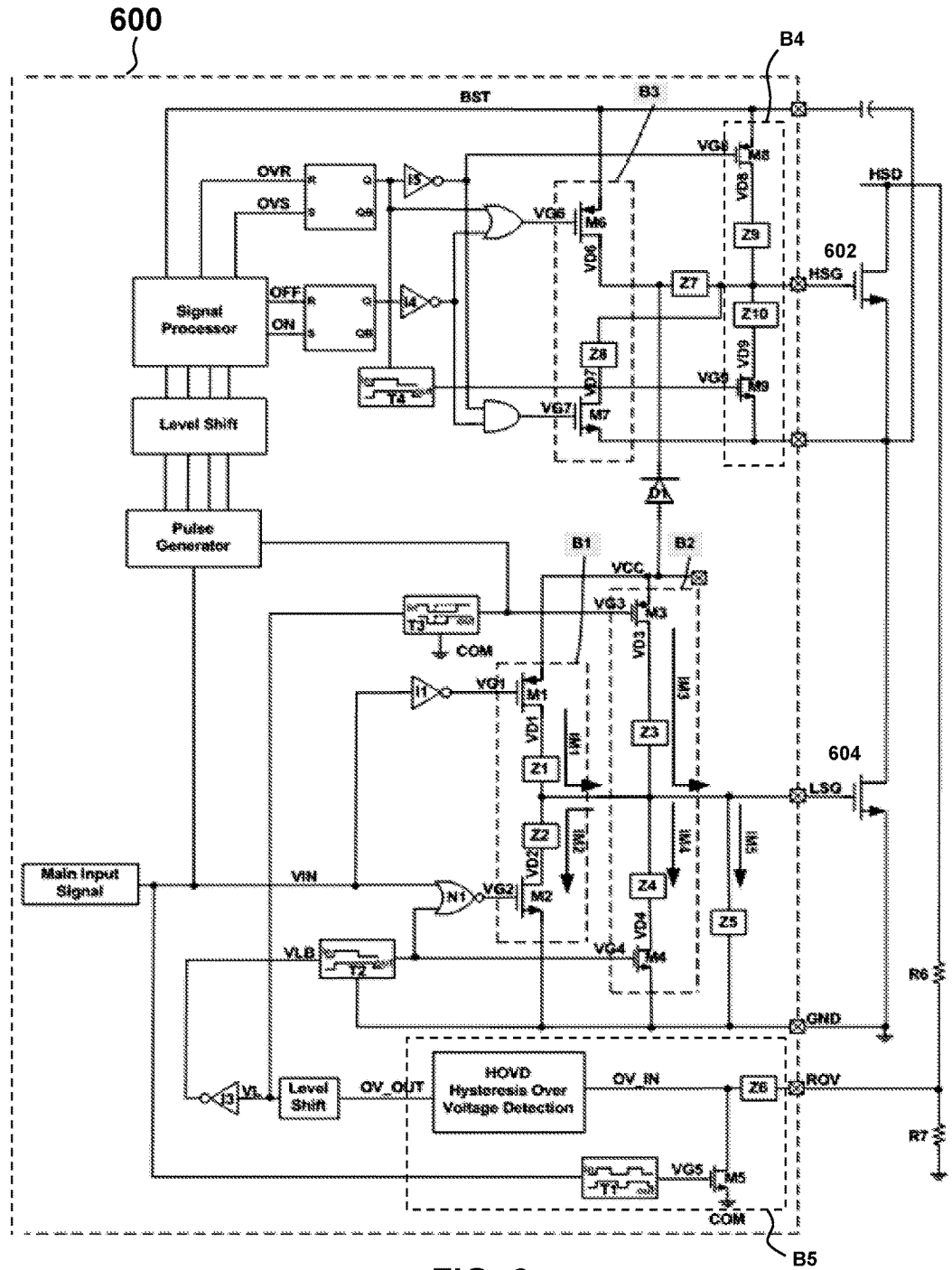
FIG. 6 is a circuit diagram illustrating a controller employed in a power switch according to aspects of the present disclosure.
Figure 7:
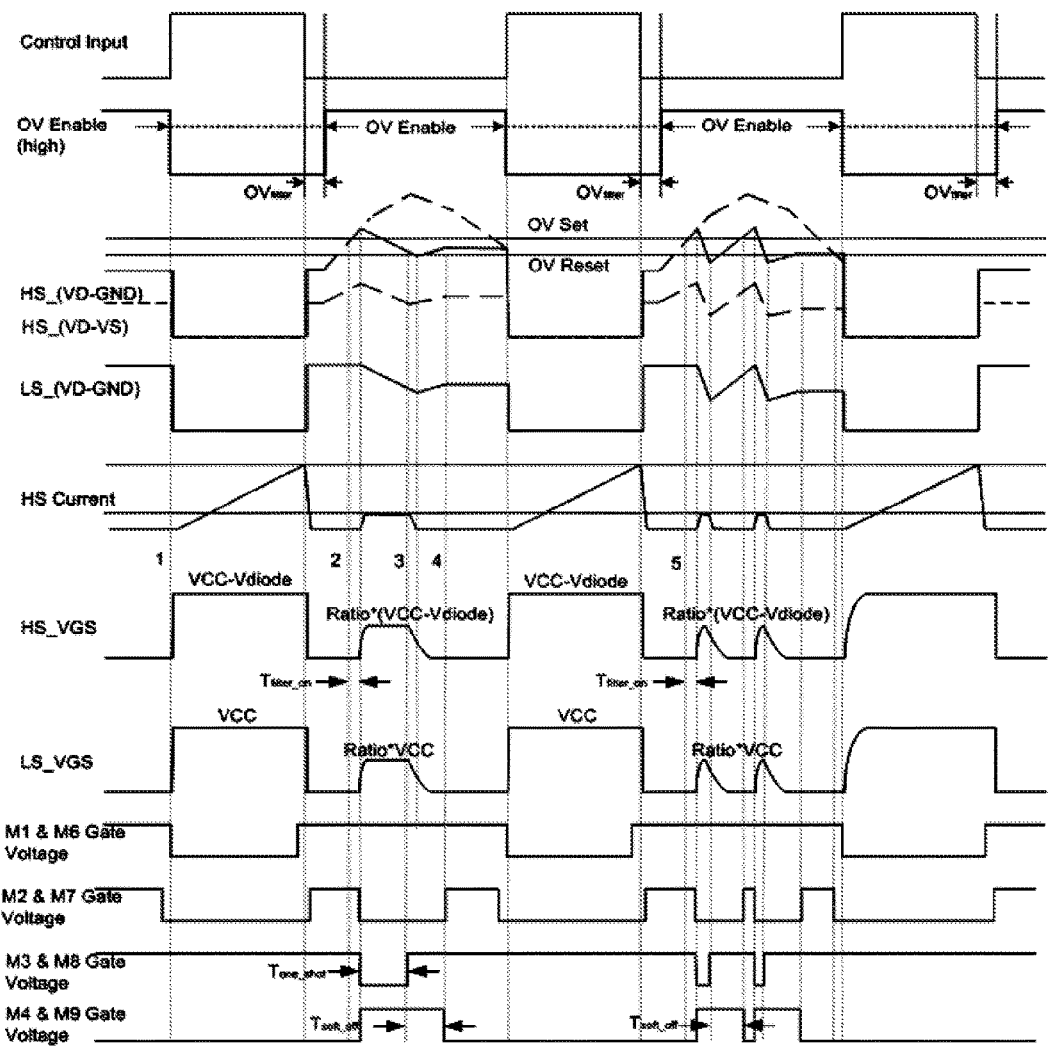
FIG. 7 is a timing diagram illustrating signal waveforms associated with the operation of a controller of FIG. 6.

FIG. 6 is a circuit diagram illustrating a controller employed in a power switch according to one aspect of the present disclosure. FIG. 7 is a timing diagram showing signal waveforms associated with the operation of a controller of FIG. 6. In this embodiment, the controller 600 includes an overvoltage protection for the cascode switch by soft clamping the gate voltages of the low-side and high-side switches 604 and 602 to control the on current and soft turning off the low-side and high-side switch 604 and 602 to prevent oscillation.

The controller 600 is coupled to the gate of the high-side switch 602 and the gate of the low-side switch 604. In this embodiment, the high-side switch 602 and the low-side switch 604 may be a power MOSFET with a lower breakdown voltage rating compared to conventional design without over voltage protection. By way of example, the high-side switch 602 and low-side switch 604 may be characterized by the same breakdown voltage, e.g., 600 V. The controller 600 has a LS gate driver B1 for driving the gate of the low-side switch 604 and a HS gate driver B3 for driving the gate of the high-side switch 602. The controller 600 also has a LS overvoltage protection circuit B2 coupled between the LS gate driver B1 and the gate of the low-side switch 604 and a HS overvoltage protection circuit B4 coupled between the HS gate driver B3 and the gate of the high-side switch 602. In addition, the controller 600 includes an overvoltage detection circuit B5 for detecting fault occurrences at the drain of high-side switch 602.

The LS gate driver B1 includes at least switches M1 and M2, and the HS gate driver B3 includes switches M6 and M7. In one embodiment, switches M1, M2, M6 and M7 are MOSFET transistors. During the normal flyback operation, switches M1 and M2 of the LS gate driver B1 and switches M6 and M7 of HS gate driver B3 are turned on and off according to the main input signal $V_{IN}$. Specifically, combination of switch M1 and impedance Z1 in the LS gate driver B1 is configured to make the desired turn-on switching performance of the low-side switch 604. In addition, combination of switch M2 and impedance Z2 is configured to make an optimal turn-off of the low-side switch 604. Similarly, combination of switch M6 and impedance Z7 in the HS gate driver B3 is configured to make the desired turn-on switching performance of the high-side switch 602 and combination of switch M7 and impedance Z8 is configured to make an optimal turn-off of the high-side switch 602. In one embodiment impedances Z1, Z2, Z7 and Z8 are resistors or combinations of resistors and capacitors.

An overvoltage detection circuit B5 of the controller 600 includes at least a detector. In one embodiment, the detector is a hysteresis overvoltage detection device HOVD, which is a high gain comparator with hysteresis band and fast response time. The detector HOVD may use band gap reference voltage (i.e., the set and reset voltages) to precisely control the voltage at the drain of the high-side switch 602 to stay in a safe level during fault conditions due to the voltage surge. The overvoltage detection circuit B5 also includes a switch M5 with a time control setting T1. Combination of the time control setting T1 and switch M5 is configured to provide a digital filter for entire PWM turn-on period and a transition from PWM on to off for avoiding malfunction of overvoltage protection due to noise coupling. In addition, impedance Z6 in the overvoltage detection circuit B5 between the detector HOVD and the drain of the high-side switch 602 provides ESD protection for switch M5 and analog filter for detector HOVD.

Once the voltage at the drain of high-side switch is higher than a set level of a fault voltage, the detector HOVD detects an overvoltage and sends a signal to deactivate switches M2 and M7, and activate the overvoltage protection circuits B2 and B4. At this time, switches M1 and M6 are off because the main input signal $V_{IN}$ is low.

The overvoltage protection circuit B2 includes at least switches M3 and M4. The overvoltage protection circuit B4 includes at least switch M8 and M9. In one embodiment, switches M3, M4, M8 and M9 are MOSFET transistors. Switches M3, M4, M8 and M9 are turned off in the normal flyback operation. When the overvoltage protection circuit B2 is activated by the overcharge detector B5, switches M3 and M4 are turned on simultaneously. Combination of switches M3 and M4 and impedances Z3 and Z4 allows a soft rise of the gate voltage of the low-side switch 604 beyond its threshold voltage. The maximum gate voltage of the low-side switch 604 is maintained or clamped by the overvoltage protection circuit B2 (i.e., the switches M3 and M4 and the Z3 and Z4) at a voltage level proportional to the resistance ratio of impedances Z3 and Z4 (i.e., Z4/(Z3+Z4) *$V_{CC}$). In one embodiment impedances Z3 and Z4 are resistors or combinations of resistors and capacitors.

The overvoltage protection circuit B4 is activated by the overcharge detector B5 via the pulse generator, level shift, signal processor and logics switches. Switches M8 and M9 are thus turned on. The combination of switches M8 and M9 and impedances Z9 and Z10 allows a soft rise of the gate voltage of the high-side switch 602 beyond its threshold voltage. The maximum gate voltage of the high-side switch 604 is maintained or clamped by the overvoltage protection circuit B4 (i.e., the switches M8 and M9 and the impedances Z9 and Z10) at a voltage level proportional to the resistance ratio of impedances Z9 and Z10 (i.e., Z10/(Z9+Z10)*($V_{CC}$ − $V_{DIODE}$)). In one embodiment impedances Z9 and Z10 are resistors or combinations of resistors and capacitors.

When the gate voltages of the low-side and high-side switches are clamped, the low-side and high-side drain current starts to ramp up discharging the low-side and high-side drain voltage. The overvoltage protection circuits B2 and B4 allow a soft clamping of the gate voltage of the low-side switch 604 and high-side switch 602 (by using switches M3, M4, M8 and M9, and impedances Z3, Z4, Z9 and Z10) so as to control the on current of both the HS switch 602 and LS switch 604. Whichever has lower current will dominant since HS switch 602 and LS switch 604 are in series.

Next, switches M3 and M8 are deactivated either when the detector HOVD of the overvoltage detection circuit B5 detects the drain voltage of the high-side switch 602 becomes lower than a reset level of the fault voltage or when the time control setting T3 expires whichever comes first. With time control settings T2 and T4, switches M4 and M9 respectively maintain turned on for a fixed amount of time to provide a soft turn-off of the low-side switch 604 and the high-side switch 602. Soft turn-off may prevent gate and line oscillation. The controller according to the present disclosure may control the sharing of the blocking voltage by adjusting the time control settings T2 and T4. When the time control T2 and T4 expires, switches M4 and M9 turn off and switches M2 and M7 turn back on to provide the strong pull low for the gate of the low-side switch 604 and the high-side switch 602 respectively. M3 and M8 will be turned on and turn off by ROV (not by one shot) because the time it takes for ROV goes above and below the OV set and OV reset threshold is shorter than one shot time. M4 and M9 keeps on for additional time for M3 rising edge. The overvoltage protection period is thus over and the overvoltage protection circuit B2 is deactivated. At this time, the normal flyback operation resumes. M3 and M8 will turn on when OV_OUT goes low during over voltage events and will be turned off either when OV_OUT goes high or by the oneshot whichever comes first during over voltage events.

According to aspects of the present disclosure, the gate voltage of the low-side switch 604 and the high-side switch 602 can be clamped and precisely controlled without any overshoot phenomena that may occur in the conventional zener-diode clamping method. The controller according to the present disclosure does not need an additional voltage supply for the reference voltage because the voltage clamping for the low-side and high-side switch 604 and 602 is set by the ratio of Z3 and Z4 and the ratio of Z9 and Z10 respectively. The controller can also provide the gate voltage control capability irrespective of temperature variation due to the same temperature dependency of impedances Z3, Z4, Z9 and Z10. The desired soft turn-off of the low-side switch 604 and the high-side switch 602 for the safe shutdown is obtained by combination of switches M4 and M9 and impedances Z4 and Z10. Therefore the overvoltage protection circuit can be simply integrated with the existing gate drive circuit.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6.

What is claimed is:

1. A power semiconductor device coupled to a load operable to draw a load current, comprising:
   a power switch having a first terminal coupled to the load, the power switch including a first power transistor coupled to the load and a second power transistor coupled in series between the first power transistor and ground; and a controller coupled to a control terminal of the power switch, wherein the controller comprises:
  a) a gate driving circuit configured to provide control of the control terminal of the power switch during normal switching operations;
  b) an overvoltage detection circuit configured to detect an overvoltage event occurring at the first terminal of the power switch; and
  c) an overvoltage protection circuit configured to provide control of the control terminal of the power switch during detection of the overvoltage event.

2. The device of claim 1, wherein the overvoltage protection circuit during the overvoltage event provides overvoltage protection by clamping at least one drain-to-source voltage of the power switch to a level less than a damage level of the power switch.

3. The device of claim 1, wherein the first and second power transistors form a cascode switch configured to switch the load current flowing through the load.

4. The device of claim 3, wherein the gate driving circuit and control terminal comprises a first gate driver coupled to a first control terminal of the first power transistor for driving the first power transistor, and a second gate driver coupled to a second control terminal of the second power transistor for driving the second power transistor.

5. The device of claim 4, wherein the first gate driver includes a first switch and a second switch, and the second gate driver includes a third switch and a fourth switch, and wherein the first and second switches respectively configured to make a desired turn-on and turn-off switching operation of the first power transistor during the normal switching operations, and the third and fourth switches respectively configured to make a desired turn-on and turn-off switching operation of the second power transistor during the normal switching operations.

6. The device of claim 3, wherein the overvoltage detection circuit includes a detector in the form of a comparator with hysteresis defining a set voltage and a reset voltage for control of a voltage at the first terminal of the first power transistor to stay at a safe level during the overvoltage event.

7. The device of claim 3, wherein the controller is coupled to control terminals of the first and second power transistors, wherein the overvoltage protection is circuit coupled between the gate driving circuit and the control terminal of the second power transistor and is configured to provide control of the power switch during the overvoltage event by clamping a voltage at the control terminal of the second power transistor to a clamp voltage of the second power transistor and turning off the second power transistor for a delayed period of time.

8. The device of claim 7, wherein the controller is configured to set a time control setting to control the delayed period of time that the second power transistor is turned off.

9. The device of claim 7, wherein the overvoltage protection circuit comprises a fifth switch and a first impedance coupled between a power supply source and the control terminal of the second power transistor, a second impedance and a sixth switch coupled between the control terminal of the second power transistor to the ground, wherein the overvoltage protection circuit is configured to allow a soft rise of the voltage at the control terminal of the second power transistor and clamp it to the clamp voltage of the second power transistor at a level proportional to a resistance ratio of the first and second impedances.

10. The device of claim 9, wherein the controller is configured to set a time control setting to set a delayed period of time to turn off the sixth switch after a turn-off of the fifth switch.

11. The device of claim 3, wherein the first and second power transistors are MOSFETs and the first power transistor has a high rating.

12. The device of claim 3, wherein the first and second power transistors are MOSFETs with a low rating.

13. The device of claim 4, wherein the controller is coupled to control terminals of the first and second power transistors, wherein the overvoltage protection circuit includes a first overvoltage protection circuitry coupled between the first gate driver and the control terminal of the first power transistor and a second overvoltage protection circuitry coupled between the second gate driver and the control terminal of the second power transistor, wherein the overvoltage protection circuit provides control of the power switch during the overvoltage event by clamping a voltage at the control terminal of the first power transistor to a first clamp voltage of the first power transistor via the first overvoltage protection circuitry, clamping a voltage at the control terminal of the second power transistor to a second clamp voltage of the second power transistor via the second overvoltage protection circuitry, turning off the second power transistor in a first delayed of time, and turning off the first power transistor in a second delayed period of time.

14. The device of claim 13, the controller is configured to set a first time control setting to control the first delayed period of time that the second power transistor is turned off and a second time control setting to control the second delayed period of time that the first power transistor is turned off.

15. The device of claim 13, wherein the second overvoltage protection circuitry comprises a fifth switch, a first impedance, a second impedance and a sixth switch, wherein the first overvoltage protection circuitry comprises a seventh switch, a third diode, a forth impedance and an eighth switch, wherein the second overvoltage protection circuitry is configured to allow a soft rise of the voltage at the control terminal of the second power transistor and clamp it to the second clamp voltage of the second power transistor at a level proportional to a resistance ratio of the first and second impedances, and wherein the first overvoltage protection circuitry is configured to allow a soft rise of the voltage at the control terminal of the first power transistor and clamp it to the first clamp voltage of the first power transistor at a level proportional to a resistance ratio of the third and fourth impedances.

16. The device of claim 15, wherein the controller is configured to set a first time control setting to control the first delayed period of time to turn off the sixth switch after a turn-off of the fifth switch and a second time control setting to turn off the eighth switch after a turn-off of the seventh switch.

* * * * *